(12) United States Patent
Zhou et al.

(10) Patent No.: US 8,691,477 B2
(45) Date of Patent: Apr. 8, 2014

(54) RETICLE DESIGN FOR THE REDUCTION OF LENS HEATING PHENOMENON

(75) Inventors: Jianming Zhou, Boise, ID (US); Anton Devilliers, Boise, ID (US); Erik Byers, Boise, ID (US)

(73) Assignee: Nanya Technology Corp., Kueishan, Tao-Yuan Hsien (TW)

(*) Notice: Subject to any disclaimer, the term of this patent is extended or adjusted under 35 U.S.C. 154(b) by 113 days.

(21) Appl. No.: 13/401,858

(22) Filed: Feb. 22, 2012

(65) Prior Publication Data

US 2013/0216795 A1 Aug. 22, 2013

(51) Int. Cl.
*G03F 9/00* (2006.01)
*G03F 1/44* (2012.01)

(52) U.S. Cl.
USPC .................................. 430/5; 355/30; 716/55

(58) Field of Classification Search
USPC ...................... 430/5, 30, 322; 355/30; 716/55
See application file for complete search history.

(56) References Cited

U.S. PATENT DOCUMENTS

2009/0244502 A1* 10/2009 Kuechler et al. ................. 355/30

\* cited by examiner

*Primary Examiner* — Stephen Rosasco
(74) *Attorney, Agent, or Firm* — Winston Hsu; Scott Margo

(57) ABSTRACT

A reticle for lens heating mitigation includes a substrate, a target pattern and a redistributive pattern. The substrate includes a live pattern region and the target pattern is disposed within the live pattern region for constructing the target pattern onto a wafer. The redistributive pattern is also disposed within the live pattern region for redistributing energy onto a lens without being printed onto the wafer and without correcting said target pattern to be printed onto the wafer.

25 Claims, 8 Drawing Sheets

RETICLE DESIGN FOR THE REDUCTION OF LENS HEATING PHENOMENON

BACKGROUND OF THE INVENTION

1. Field of the Invention

The present invention relates to a reticle with a pattern which is able to mitigate lens heating by redistributing heat onto a lens, and to a method for designing a reticle that redistributes heat onto a lens to mitigate lens heating. In particular, the present invention relates to a reticle with a redistributive pattern which is able to mitigate lens heating without substantially changing the imaging of a target pattern, and a method for designing the redistributive pattern on a reticle to redistribute heat onto a lens to mitigate lens heating.

2. Description of the Prior Art

Lens heating is a phenomenon which is driven by a high power laser that has been absorbed by a lens material or a lens mounting. Lens heating is a common issue in the semiconductor industry, especially for memory manufacturers, and is caused by an unbalanced heat load in the lens due to a highly periodic structure on a reticle.

Once a lens is heated, aberrations will be introduced into the lens system and will degrade the imaging quality. Due to this lens heating problem, the lens aberrations increase when a same pattern is continuously exposed on the scanner. The aberrations can drift and become larger or smaller. In other words, if an aberration starts at some value, it can be positive (go up) or negative (go down) as the lens is heated. The hotter spots may make the aberration drift positive or negative. Lens heating can be reduced if the heat load is more balanced by rearranging the dummy area which is the area that will not have any pattern that can be imaged onto a wafer.

When a reticle only has an entire live pattern, such a method is useless because there is no dummy area to accommodate the solution. A live pattern is the pattern which needs to be transferred and printed onto a wafer. It can be electrically important for device circuits. It can also be some pattern that is not electrically important, such as CMP pads. A dummy area is the area which has no live pattern.

For example, in dummy area, a proposal known as SRF (sub-resolution fill) is used to fill the area with the sub-resolution feature. FIG. 1A illustrates an example of the sub-resolution fill solution. A reticle 10 includes a dummy area 11 and a live pattern area 13. The dummy area 11 is full of sub-resolution fill 12 and the live pattern area 13 full of live pattern 14. When light 50 pass through the reticle 10, a heat load 31 is distributed on the lens 30 and a corresponding image 44 is printed in the wafer 40. The heat load is not a direct copy of what the pattern is originally like. It is the diffraction pattern of the reticle 10. Because the sub-resolution fills 12 are below the resolution limit, the dummy area 11 printed on the wafer 10 will still not show any pattern. The sub-resolution fills 12 of the sub-resolution fill solution are accordingly able to cope with the lens heating problem.

Also, the reticle 10 may include other pattern which is not electrically related or important. FIG. 1B illustrates an example of the CMP (chemical mechanical polishing) fill solution. A reticle 10 includes a CMP pad area 11 and a live pattern area 13. The CMP pad area 11 is full of pad pattern 12 and the live pattern area 13 full of live pattern 14. The pad pattern 12 is used to facilitate the CMP procedure and not electrically related or important. When light 50 pass through the reticle 10, a heat load 31 is formed on the lens 30 and a corresponding image 44 is printed in the wafer 40. Also, the pad pattern image 42 is formed on the wafer 40. Because the pad pattern 12 is used to facilitate the CMP procedure and not electrically related or important, area filled with pad pattern image 42 is not electrically related or important but for CMP benefit. There is no lens heating benefit.

Currently, there is no prior art that utilizes the live pattern area for lens heating mitigation.

SUMMARY OF THE INVENTION

This invention therefore proposes a new pattern design that will help to produce a balanced heat load in the lens to mitigate lens heating issues. Also, a new method that incorporates sub resolution features and chromeless phase shift lithography (CPL) in the live pattern area to achieve desired lens heating friendly heat load is proposed. The principal difference to the prior art is that the invention changes the live pattern reticle design but not the dummy area reticle design, and the changed reticle still has a live pattern printed properly while the lens heating problem is mitigated.

The present invention in a first aspect proposes a reticle for lens heating mitigation. The reticle of the present invention includes a substrate, a target pattern and a redistributive pattern. The substrate includes a live pattern region and the target pattern is disposed within the live pattern region for constructing the target pattern onto a wafer. The redistributive pattern is also disposed within the live pattern region for redistributing energy onto a lens without being printed onto the wafer and without substantially correcting the target pattern to be printed onto the wafer.

In one embodiment of the present invention, the substrate comprises at least one of quartz and an absorbing material.

In another embodiment of the present invention, a dimension of the target pattern and a dimension of the redistributive pattern are different.

In another embodiment of the present invention, the target pattern is used to construct an electronic device.

In another embodiment of the present invention, the redistributive pattern is disposed within the target pattern.

In another embodiment of the present invention, the redistributive pattern is a sub-resolution fill for a chemical mechanical polishing pad.

In another embodiment of the present invention, the reticle for mitigating the lens heating further comprises a plurality of target patterns which are disposed within the live pattern region and a plurality of redistributive patterns which are disposed within the live pattern region. One of the redistributive patterns is disposed between the target patterns.

In another embodiment of the present invention, the redistributive pattern has a dimension beyond the resolution of a lithographic capability.

In another embodiment of the present invention, the redistributive pattern has at least one of a vertical orientation, a horizontal orientation and a tilted orientation with respect to the target pattern.

In another embodiment of the present invention, the redistributive pattern has a periodic line/space feature with a feature pitch from about 50 nm to about 150 nm.

In another embodiment of the present invention, the redistributive pattern renders the lens to have no substantial aberration response.

In another embodiment of the present invention, the redistributive pattern renders the lens to have a balanced heat load.

In another embodiment of the present invention, the redistributive pattern maintains an imaging fidelity for the target pattern.

The present invention in another aspect proposes a method for designing a reticle for redistributing heat onto a lens. First, a target pattern and a lens are provided. A lens heating sensitivity map is generated in accordance with the target pattern and with the lens. It is determined if the target pattern forms a balanced heat load on the lens or not. A redistributive pattern is introduced to be adjacent to the target pattern if the target pattern does not form the balanced heat load on the lens. It is then determined if the redistributive pattern along with the target pattern forms the balanced heat load on the lens or not. The redistributive pattern and the target pattern are output for forming a reticle which is capable of forming a balanced heat load on the lens when the redistributive pattern along with the target pattern forms the balanced heat load on the lens.

In one embodiment of the present invention, the method for designing a reticle for redistributing heat onto a lens further comprises the following steps.

The redistributive pattern is redesigned and it is determined again if the redesigned redistributive pattern along with the target pattern forms the balanced heat load on the lens or not until a positive determination is made.

In another embodiment of the present invention, the target pattern is used to construct an electronic device.

In another embodiment of the present invention, the redistributive pattern is disposed within the target pattern.

In another embodiment of the present invention, a dimension of the target pattern and a dimension of the redistributive pattern are different.

In another embodiment of the present invention, one of a plurality of the redistributive patterns is disposed between a plurality of the target patterns.

In another embodiment of the present invention, the redistributive pattern has a dimension beyond the resolution of a lithographic capability.

In another embodiment of the present invention, the redistributive pattern has at least one of a vertical orientation, a horizontal orientation and a tilted orientation with respect to the target pattern.

In another embodiment of the present invention, the redistributive pattern has a periodic line/space feature with a feature pitch from about 50 nm to about 150 nm.

In another embodiment of the present invention, determining if the redistributive pattern along with the target pattern forms the balanced heat load on the lens or not further comprises determining if the redistributive pattern has a substantial aberration response with respect to the lens or not.

In another embodiment of the present invention, the redistributive pattern is introduced to render the lens to have the balanced heat load.

In another embodiment of the present invention, the redistributive pattern is introduced to maintain an imaging fidelity for the target pattern with respect to the lens.

These and other objectives of the present invention will no doubt become obvious to those of ordinary skill in the art after reading the following detailed description of the preferred embodiment that is illustrated in the various figures and drawings.

DETAILED DESCRIPTION

The present invention in a first aspect provides a method for designing a reticle for redistributing heat onto a lens. The method of the present invention is capable of introducing a redistributive pattern on a live pattern region of a reticle in accordance with a lens heating sensitivity map. The redistributive pattern on the reticle does not print on a wafer because the redistributive pattern is beyond the resolution limit of a lithographic capability but the redistributive pattern helps redistribute the energy onto a lens to mitigate a lens heating problem.

Figure 1A:
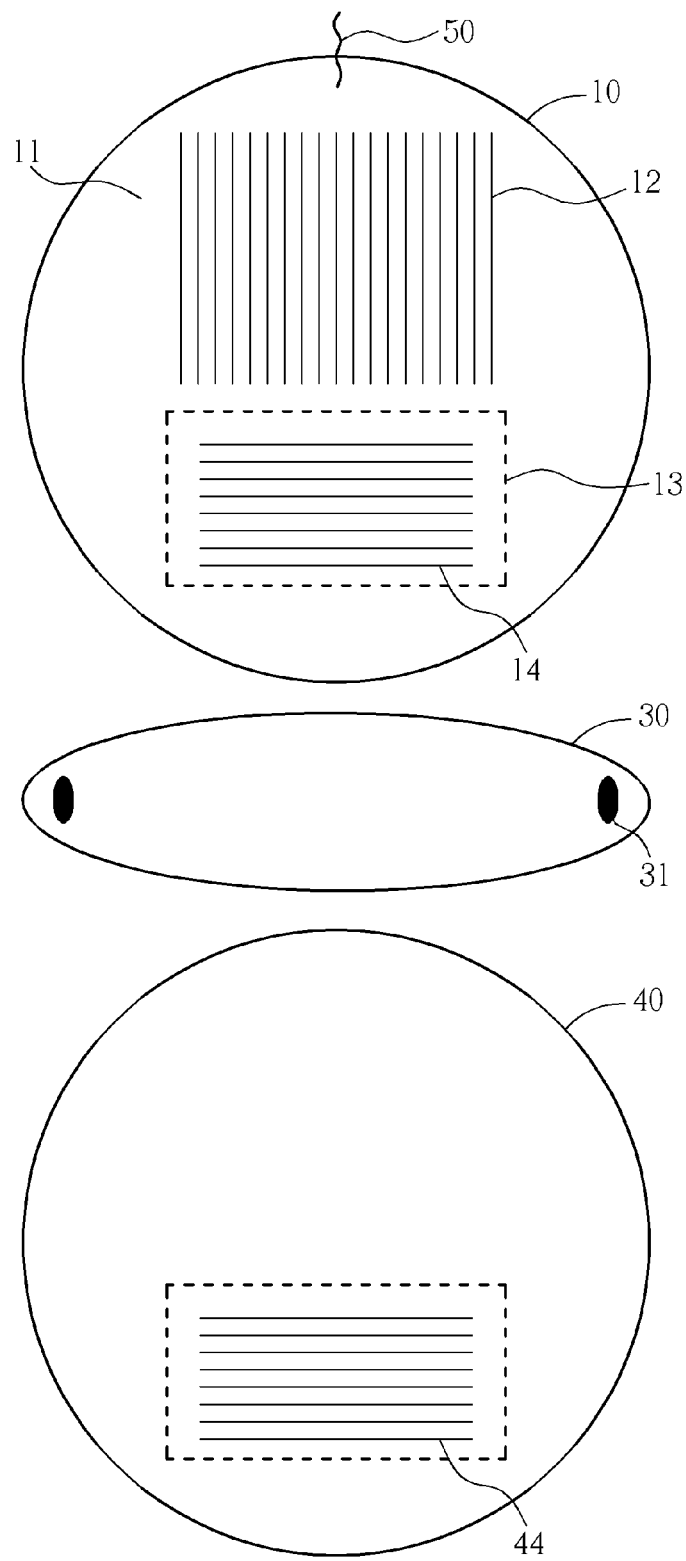
FIG. 1A illustrates an example of the sub-resolution fill solution.
Figure 1B:
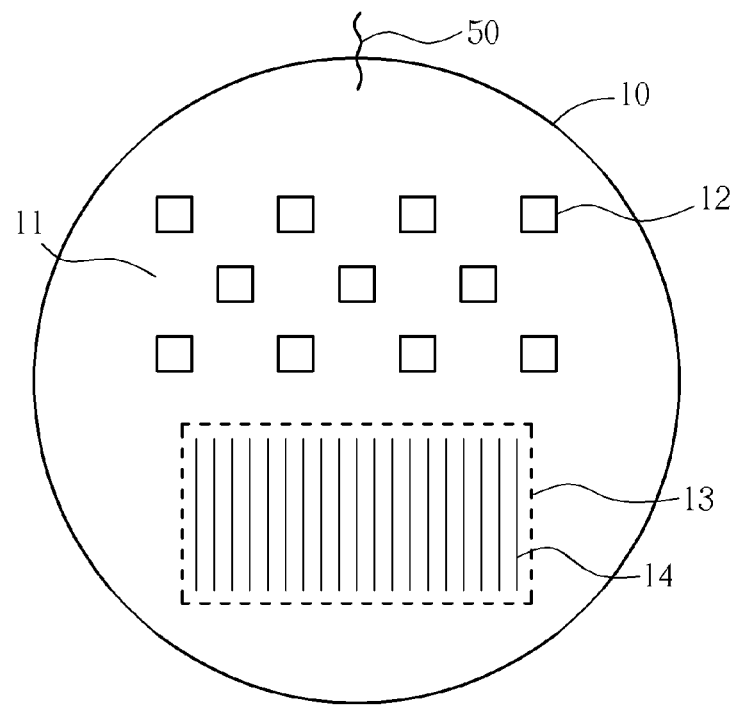
FIG. 1B illustrates an example of the CMP (chemical mechanical polishing) fill solution.
Figure 1B:
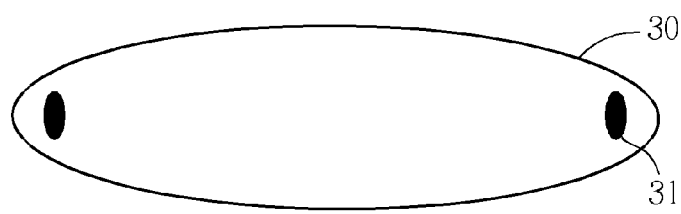
Figure 1B:
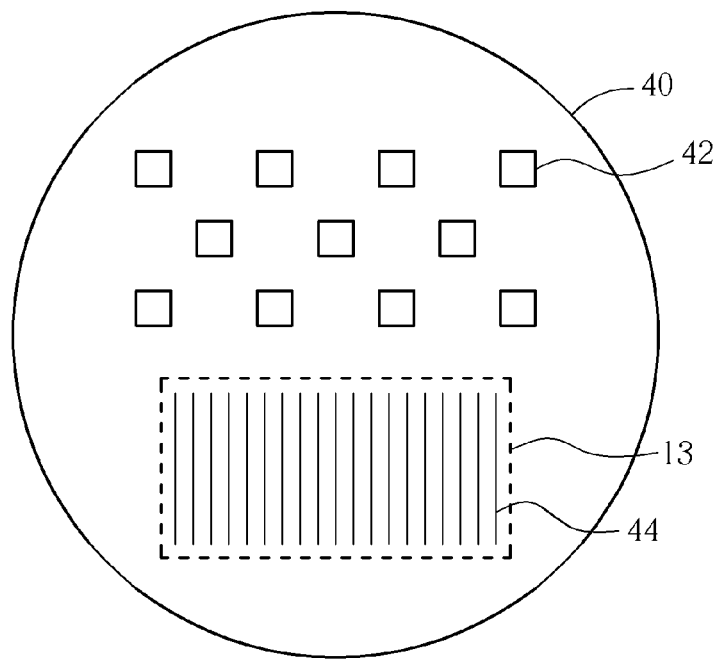
Figure 2:
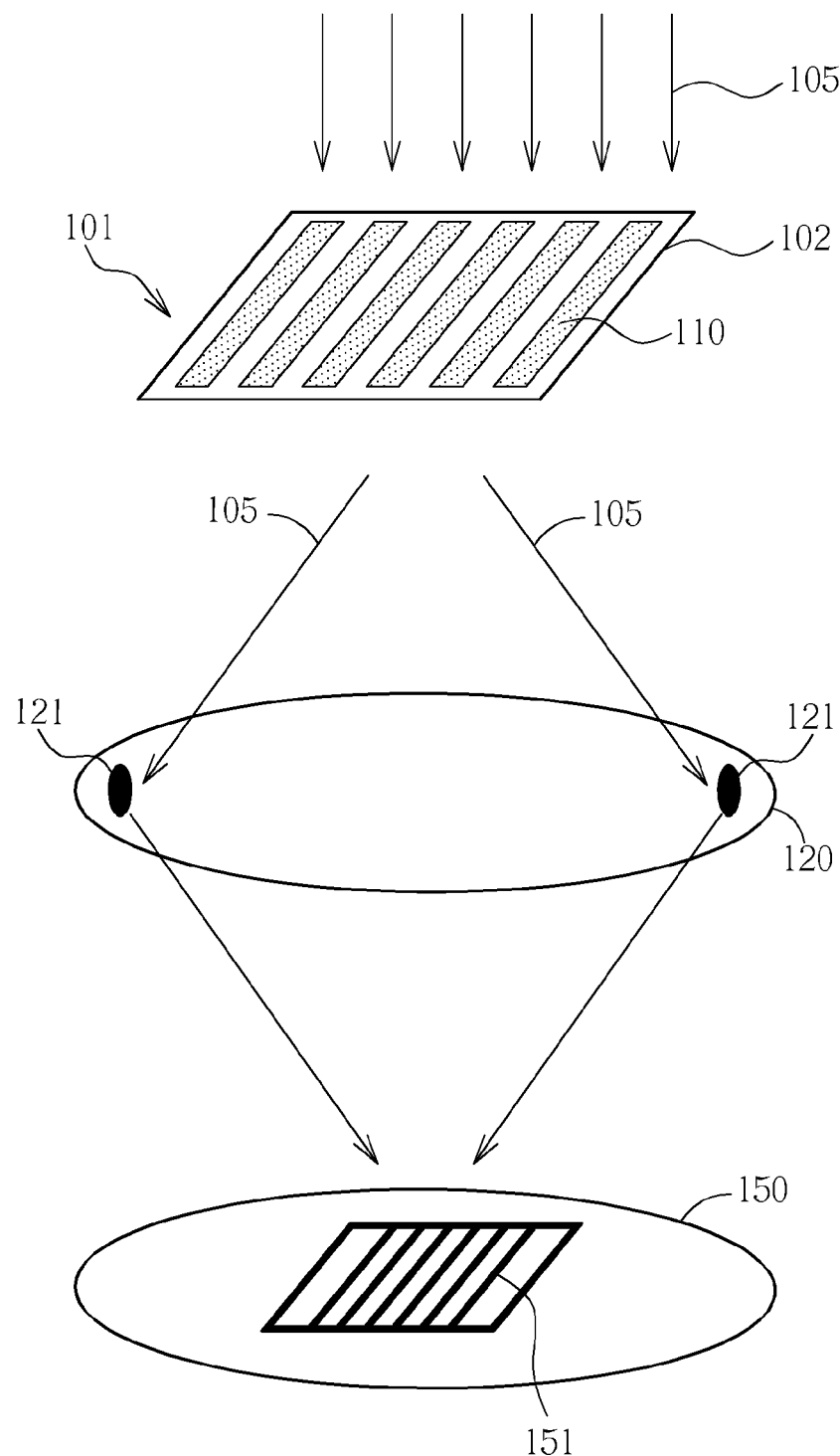
FIGS. 2-4 illustrate a method for designing a reticle to redistribute heat onto a lens of the present invention.
Figure 3:
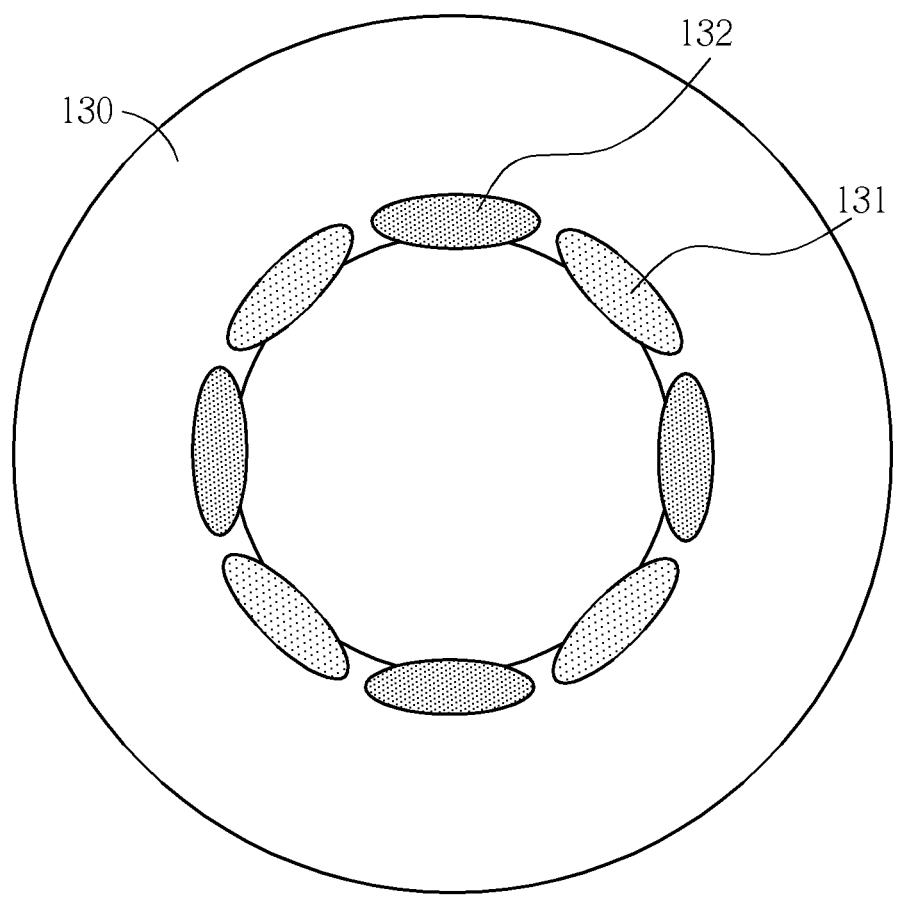

Please refer to FIGS. 1-3, which illustrate a method for designing a reticle to redistribute heat onto a lens of the present invention. First, as shown in FIG. 2, a test reticle 101 includes a substrate 102 and a target pattern 110. The target pattern 110 occupies 100% of a reticle 101, therefore, no space for dummy area to put subres fill. A lens or a lens set 120 is provided. In general, a lens or a lens set 120 is a complicated lens system with many lens elements and used to project the target pattern 110 to the substrate 150 to print the projection pattern. The target pattern 110 may be formed with a chromeless phase shift mask or traditional attenuated phase shift mask. After a given light 105 passes through the target pattern 110 in a suitable condition, the target pattern 110 makes the light 105 form a diffraction pattern 121, usually consisting of several dots on the lens 120. Since light is a form of energy, the diffraction pattern 121 accordingly gives the lens 120 a heat load. An uneven heat load on the lens 120 will cause the lens 120 to have aberration. The generated aberration will then impact imaging performance of the lens 120.

As shown in FIG. 3, a lens heating sensitivity map 130 is generated by heating certain part of the lens 120 and testing the lens 120 response. The lens heating sensitivity map 130 is independent of a pattern design, so it can be experimentally characterized by heating up small part of the lens 120, then measuring the lens response in terms of aberration over time. The lens heating sensitivity map 130 can show how each part of the lens 120 can respond to the heat load. Based on the reticle design, it is known what heat load can be generated. With the information, if the lens response is not desired, the pattern on the reticle can be redesigned based on the lens heating sensitivity map 130 so a better lens heating response can be obtained by heating the area with desired lens response.

The lens heating sensitivity map 130 also helps to guide reticle design without doing experiments. The way to use the lens heating sensitivity map 130 for reticle design may be as follows. The map is checked. If a design of a reticle is known to cause some heat to be on a sensitive area, then a modified design should be come up with to avoid that area. Or alternatively, some pattern is generated to have some opposite response to cancel the existing aberration Although the lens heating sensitivity map 130 does not include the current heat load, but the heat load can be overlapped with the sensitivity map to predict how lens 120 will respond to the heat load. Once the lens 120 is heated, aberration will be introduced into the lens system and will degrade imaging quality. Due to the lens heating problem, the lens aberration will increase when the same target pattern 110 is continuously exposed on the scanner. The aberration can drift larger or smaller. If it starts at zero, it can undergo a positive drift 131 (go up) or a negative drift 132 (go down) as the lens 120 is heated.

Figure 5:
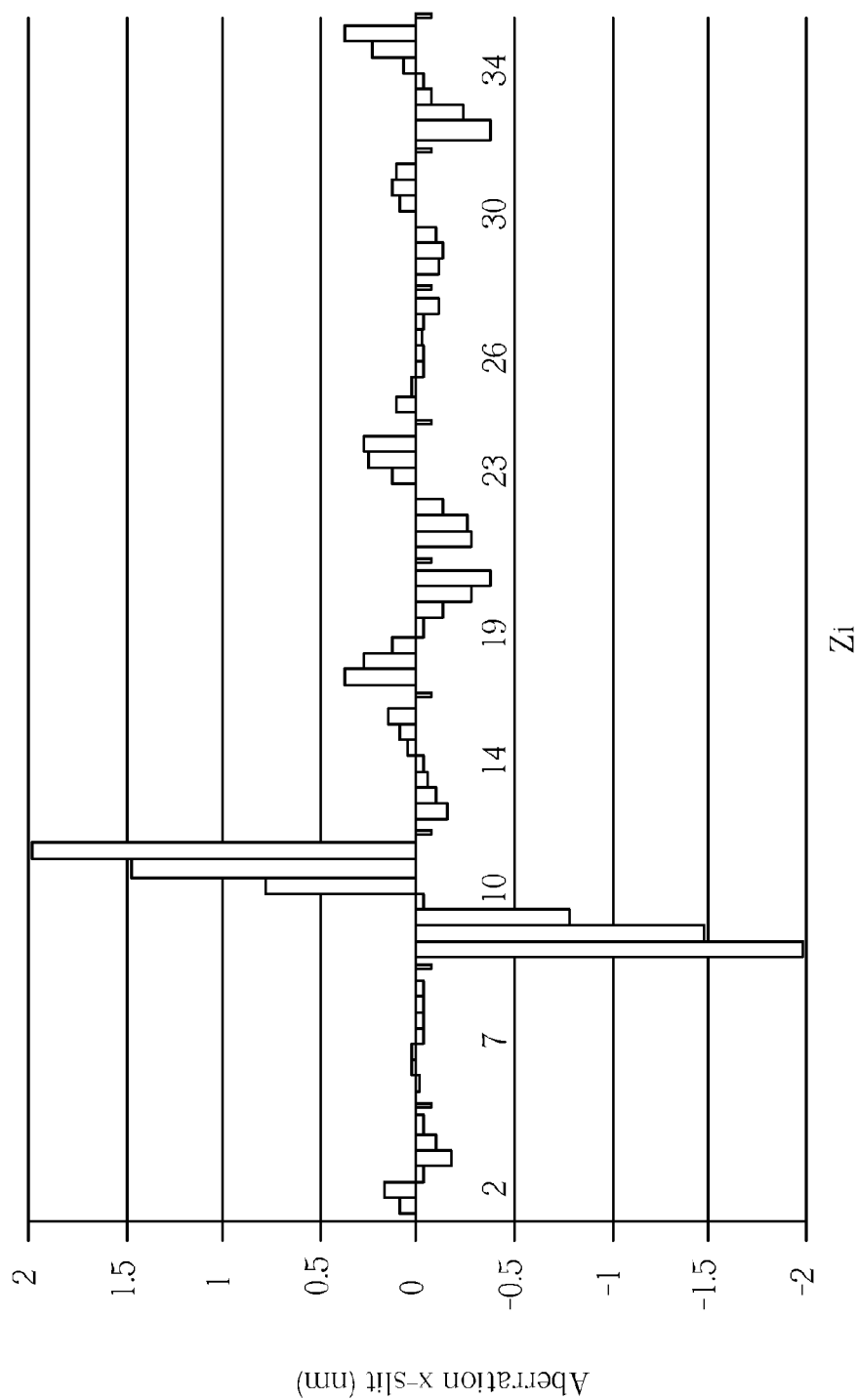
FIG. 5 illustrates a result of a test reticle according to a target pattern forms an unbalanced heat load on a lens.

The lens heating sensitivity map 130 is used to determine if the target pattern 110 forms a balanced heat load on the lens 120 or not. If a diffraction pattern can hit the region 131 and region 132 in a somewhat balance way, then they will cancel each other and the heat load is more balanced. If they all hit only one of the region 131 and the region 132, then a drift is expected. The lens response is constantly measured till a flat response over time is observed. If there is a balanced heat load on the lens 120, the target pattern 110 is ready to be output for forming a working reticle (not shown) but this is usually not the case. FIG. 5 illustrates a result of a test reticle according to a target pattern forms an unbalanced heat load on a lens.

The more common situation is that the target pattern 110 does not form a balanced heat load on the lens 120. A novel solution is consequently needed. The method of the present invention provides a redistributive pattern which is introduced to solve the problem without substantially changing the essence of the target pattern 110. In one embodiment of the present invention, a redistributive pattern is introduced to be on top of the target pattern 110 on the test reticle 101 when the target pattern 110 does not form the balanced heat load on the lens 120. The redistributive pattern is introduced to render the lens 120 to have the balanced heat load.

Once the lens heating sensitivity map 130 is generated, the heat load can be manipulated to attempt to make the heat be loaded at some area where the lens 120 is not sensitive. Alternatively, an attempt can be made to balance the heat load, meaning some heat load can be generated that can hit areas with a different lens response (some positive, some negative) and thereby achieve an overall aberration response that is almost zero or reduced. Accordingly, the lens heating sensitivity map 130 can be utilized as a guide to design the redistributive pattern 140.

Figure 4:
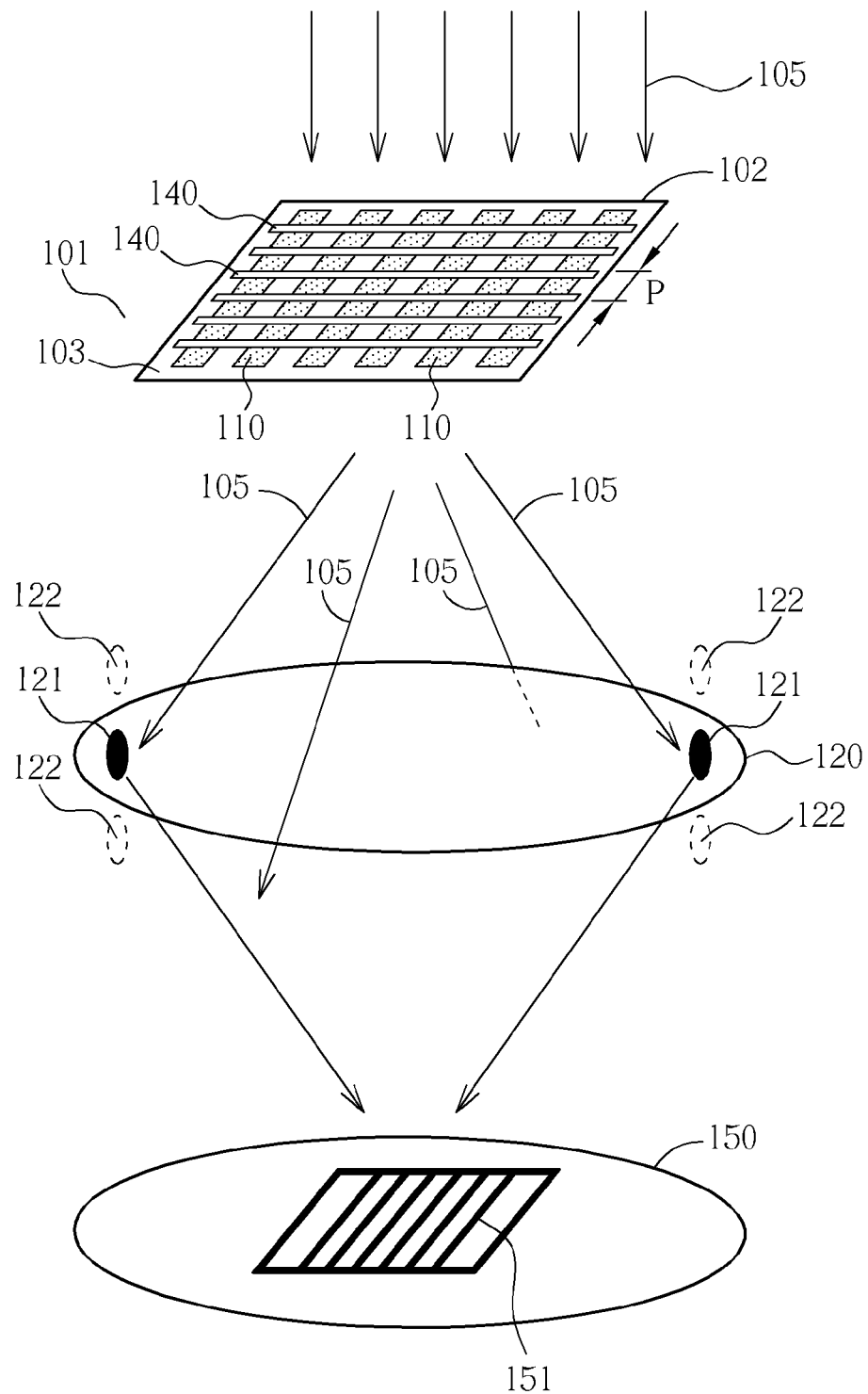

Please refer to FIG. 4. FIG. 4 illustrates a demonstrative result of the test reticle 101 with a redistributive pattern 140. The test reticle 101 includes a substrate 102, a target pattern 110 and a redistributive pattern 140. The substrate 102 includes a live pattern region 103 and the target pattern 110 is disposed within the live pattern region 103 for constructing the target pattern 110 onto a wafer 150. The substrate 102 may include at least one of quartz and an absorbing material, such as a metal compound like MoSi. The target pattern 110 is used to construct an electronic device, such as a MOS or a flash memory cell.

The redistributive pattern 140 is also disposed within the live pattern region 103 for redistributing energy (light 105) onto the lens 120. One of the features of the present invention is that the redistributive pattern 140 has an extreme dimension, such as a line width W or a line pitch P, which is beyond the resolution capability of the lithography so that the redistributive pattern 140 is not printed on the wafer (not shown).

For example, there may be a plurality of target patterns 110 and a plurality of redistributive patterns 140. One of the redistributive patterns 140 is disposed between the target patterns 110, as shown in FIG. 4. Optionally, the redistributive patterns 140 may have a smaller dimension or a larger dimension than the dimension of the target patterns 110 as long as the redistributive patterns 140 is beyond the resolution capability of the lithography. For example, if the redistributive pattern 140 is on perpendicular direction with the target patterns 110, the redistributive pattern 140 can be larger than the target patterns 110, but is still beyond resolution limit. The live pattern 110 can be one dimensional (such as line/space only) or two-dimensional.

In some cases, there may be a pattern (usually called an assist pattern) which is used in an optical proximity correction (OPC) process to assist the correction of the optical proximity for the target patterns 110. These OPC features are added to help live pattern printing. The redistributive pattern 140 of the present invention, however, does not and is not intended to correct the optical proximity for the target pattern 110 which is about to be printed onto the wafer (not shown) or impact live feature printing.

In another embodiment of the present invention, the redistributive pattern 140 is disposed within the target pattern 110, as shown in FIG. 5. For example, the redistributive patterns 140 may be tilted lines disposed within the CMP fill pattern 115 when chromeless phaseshift lithography is used for the CMP fill pattern 115. When chromeless phaseshift lithography is used for the CMP fill pattern, then strong first order light will help to balance the heat load and achieve a better lens heating performance.

In such a way, the CMP fill pattern 115 in the form of a rectangular block, is used to print a rectangular block on a reticle. If the CMP fill pattern 115 is segmented to form smaller blocks with many small lines to be more "lens heating friendly", the entire CMP fill pattern 115 can still be printed on the wafer to give the same result the original design, i.e. as if the original design were not segmented. These smaller segments will not print, but a diffraction pattern will be engineered to what we need. This method may be called a target pattern segmentation.

Figure 6:
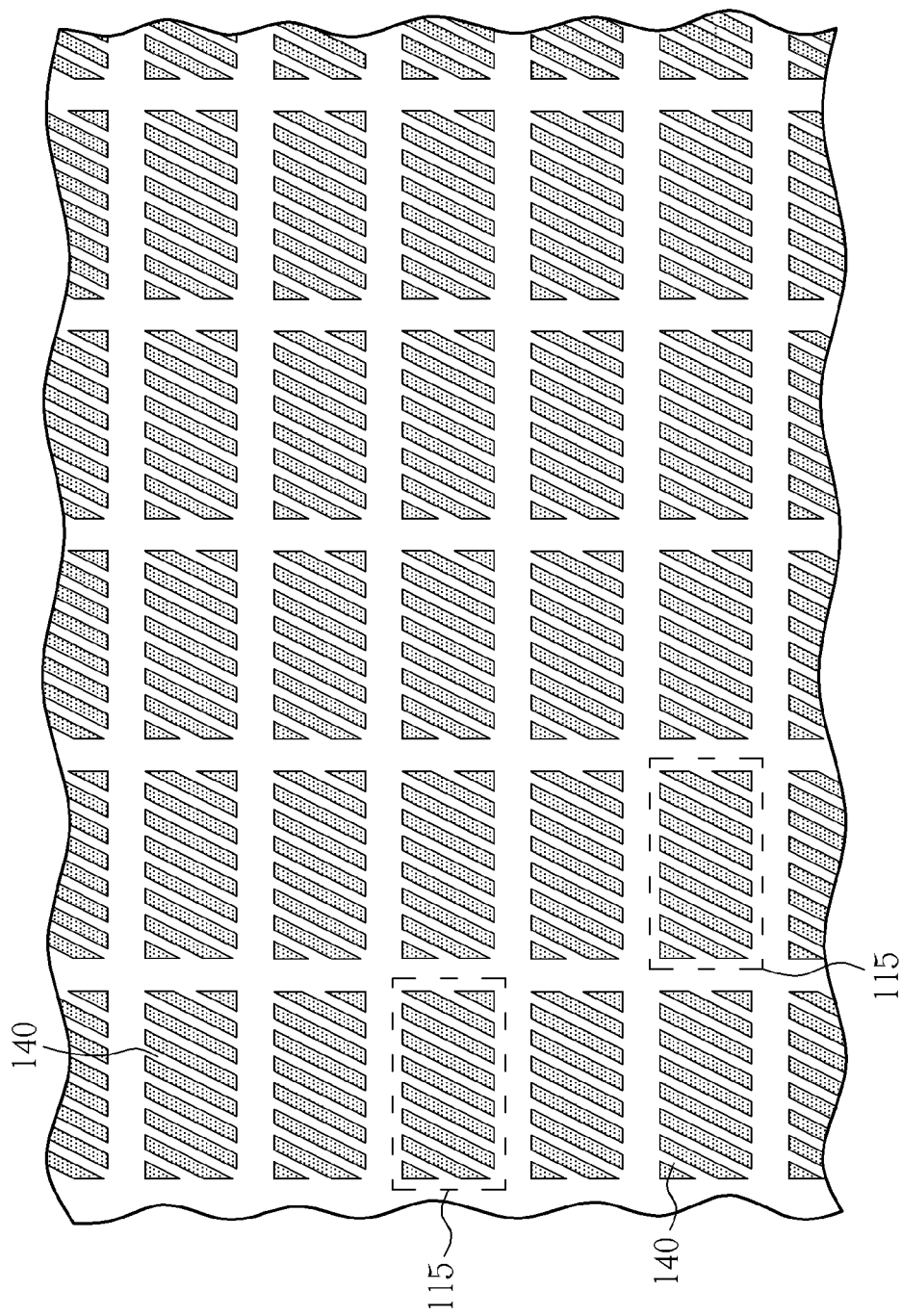
FIG. 6 illustrates a redistributive pattern disposed within a target pattern of a test reticle according to the present invention.

In one embodiment of the present invention, the redistributive pattern 140 may have a perpendicular orientation with respect to the target pattern 110, as shown in FIG. 4. In another embodiment of the present invention, the redistributive pattern 140 may have a horizontal orientation with respect to the target pattern 110. In still another embodiment of the present invention, the redistributive pattern 140 may have a tilted orientation with respect to the target pattern 110, as shown in FIG. 6.

The dimension of the target pattern and the dimension of the redistributive pattern may be the same or different. For example, the redistributive pattern 140 may be a periodic line/space feature having a feature pitch from about 50 nm to about 150 nm. The feature width varies depending on different imaging conditions, provided the redistributive pattern 140 is not printed on the wafer (not shown). If some horizontal line/space feature is introduced into the live pattern region 103, as long as the feature pitch is smaller than the resolution limit, these features (i.e. the redistributive pattern 140) will not be printed on the wafer (not shown), but these features will generate some heat load along different orientations to achieve a balanced overall heat load. Please note that the resolution limit may depend on both the dimension and the orientation.

Next, a test reticle 101 is determined according to whether the redistributive pattern 140 along with the target pattern 110 forms the balanced heat load on the lens 120 or not. The design of the redistributive pattern 140 can be tested by a lens model, wherein the lens 120 response is simulated. The appearance of large aberrations means the design of the redistributive pattern 140 is still not lens heating friendly, as shown in FIG. 5.

Figure 7:
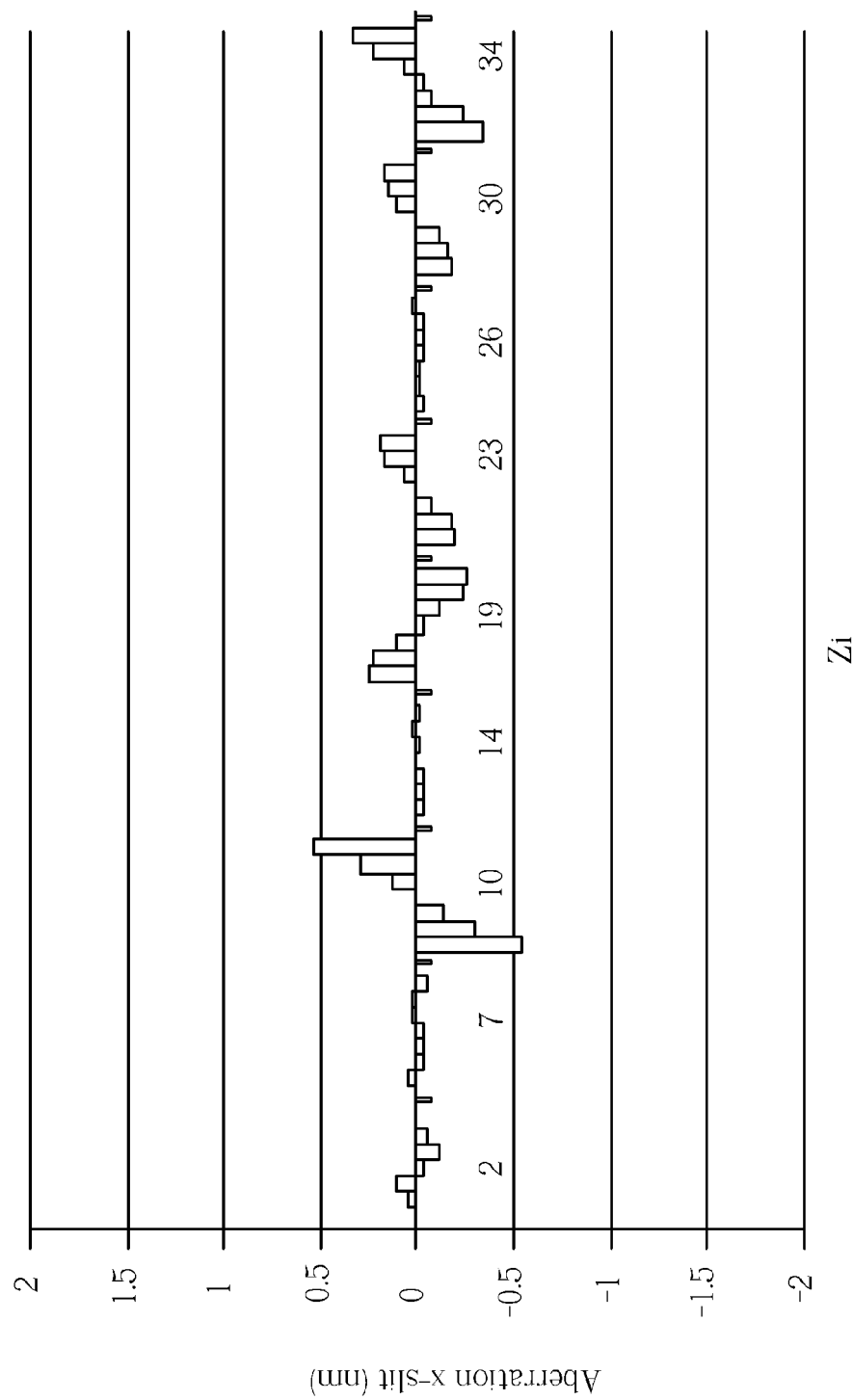
FIG. 7 illustrates a result of the test reticle with the redistributive pattern according to the present invention along to form a balanced heat load on a lens.

The heat load can be experimentally measured: for example, the lens heating sensitivity map 130 is determined according to whether the redistributive pattern 140 has a substantial flat aberration response with respect to the lens 120 or not. For example, for some particular aberration which attracts the attention, if the simulated drift over time is still large, then it is not good enough, as shown in FIG. 5. If there is no drift or the magnitude is relatively small, then the lens heating response is good, as shown in FIG. 7. Correspondingly, the heat load on the lens 120 is redistributed as shown by the dotted region 122 of FIG. 4, to result in a better heat load and less lens heating.

If the redistributive pattern 140 has no substantial aberration response with respect to the lens 120, the target pattern 110 and the redistributive pattern 140 are ready to be output for forming a working reticle (not shown). If the redistributive pattern 140 has substantial aberration response with respect to the lens 120, or the lens heating sensitivity map 130 does not show a balanced heat load on the lens 120, further adjustment of the redistributive pattern 140 is required.

For example, when the redistributive pattern 140 along with the target pattern 110 does not form the balanced heat load on the lens 120, the redistributive pattern 140 is redesigned or fine-tuned. Furthermore, the lens heating sensitivity map 130 is used again to exam whether the redistributive pattern 140 along with the target pattern 110 forms the balanced heat load on the lens 120 or not.

If the redistributive pattern 140 along with the target pattern 110 forms the balanced heat load on the lens 120, the target pattern 110 and the redistributive pattern 140 are ready to be output for forming a working reticle (not shown). If the redistributive pattern 140 along with the target pattern 110 again does not form the balanced heat load on the lens 120, the redistributive pattern 140 is again redesigned based on lens heating sensitivity map 130. New design is simulated again until the redesigned redistributive pattern 140 along with the target pattern 110 forms the balanced heat load on the lens 120. At this point, the target pattern 110 and the redistributive pattern 140 are ready to be output for forming a working reticle 104 which is capable of forming the balanced heat load on the lens 120.

After being suitably adjusted, the redistributive pattern 140 renders the lens 120 with no or reduced aberration response. Or, the redistributive pattern 140 finally renders the lens 120 to have a significantly balanced heat load. As a result, the redistributive pattern 140 is able to maintain an imaging fidelity for the target pattern 110.

To summarize, the present invention provides a new reticle design method for lens heating mitigation. The present invention redesigns the live pattern for lens heating benefit. With this design, lens heating can be significantly balanced by a better heat load signature. The heat load signature shows which part of the lens is heated.

Those skilled in the art will readily observe that numerous modifications and alterations of the device and method may be made while retaining the teachings of the invention.

What is claimed is:

1. A reticle for mitigating lens heating, comprising:
   a substrate comprising a live pattern region;
   a target pattern disposed within said live pattern region for constructing said target pattern onto a wafer; and
   a redistributive pattern disposed within said live pattern region for redistributing energy onto a lens without being printed onto said wafer and without correcting said target pattern to be printed onto said wafer.

2. The reticle for mitigating lens heating of claim 1, wherein a dimension of said target pattern and a dimension of said redistributive pattern are different.

3. The reticle for mitigating lens heating of claim 1, wherein said substrate comprises at least one of quartz and an absorbing material.

4. The reticle for mitigating lens heating of claim 1, wherein said target pattern is used to construct an electronic device.

5. The reticle for mitigating lens heating of claim 1, wherein said redistributive pattern is disposed within said target pattern.

6. The reticle for mitigating lens heating of claim 5, wherein said redistributive pattern is a sub-resolution fill for a chemical mechanical polishing pad.

7. The reticle for mitigating lens heating of claim 1, further comprising:
   a plurality of said target patterns disposed within said live pattern region; and
   a plurality of said redistributive patterns disposed within said live pattern region, wherein one of said redistributive patterns is disposed between said target patterns.

8. The reticle for mitigating lens heating of claim 1, wherein said redistributive pattern has a dimension beyond the resolution limit of a lithographic system.

9. The reticle for mitigating lens heating of claim 1, wherein said redistributive pattern has at least one of a vertical orientation, a horizontal orientation and a tilted orientation with respect to said target pattern.

10. The reticle for mitigating lens heating of claim 1, wherein said redistributive pattern has a periodic line/space feature with a feature pitch from about 50 nm to about 150 nm.

11. The reticle for mitigating lens heating of claim 1, wherein said redistributive pattern renders said lens to have reduced aberration response.

12. The reticle for mitigating lens heating of claim 1, wherein said redistributive pattern renders said lens to have a balanced heat load.

13. The reticle for mitigating lens heating of claim 1, wherein said redistributive pattern maintains an imaging fidelity for said target pattern.

14. A method for designing a reticle for redistributing heat onto a lens, comprising:
   providing a target pattern and a lens;
   generating a lens heating sensitivity map in accordance with said target pattern and with said lens;
   determining if said target pattern forms a balanced heat load on said lens or not;
   introducing a redistributive pattern adjacent to said target pattern if said target pattern does not form said balanced heat load on said lens;
   determining if said redistributive pattern along with said target pattern forms said balanced heat load on said lens or not; and
   outputting said redistributive pattern and said target pattern for forming a reticle which is capable of forming said balanced heat load on said lens when said redistributive pattern along with said target pattern forms said balanced heat load on said lens.

15. The method for designing a reticle for redistributing heat onto a lens of claim 14, further comprising:
   redesigning said redistributive pattern and determining if said redesigned redistributive pattern along with said target pattern forms said balanced heat load on said lens or not till said redesigned redistributive pattern along with said target pattern forms said balanced heat load on said lens when said redistributive pattern along with said target pattern does not form said balanced heat load on said lens.

16. The method for designing a reticle for redistributing heat onto a lens of claim 14, wherein said target pattern is used to construct an electronic device.

17. The method for designing a reticle for redistributing heat onto a lens of claim 14, wherein said redistributive pattern is disposed within said target pattern.

18. The method for designing a reticle for redistributing heat onto a lens of claim 17, wherein a dimension of said target pattern and a dimension of said redistributive pattern are different.

19. The method for designing a reticle for redistributing heat onto a lens of claim 14, wherein one of a plurality of said redistributive patterns is disposed between a plurality of said target patterns.

20. The method for designing a reticle for redistributing heat onto a lens of claim 14, wherein said redistributive pattern has a dimension beyond the resolution of a lithographic capability.

21. The method for designing a reticle for redistributing heat onto a lens of claim 14, wherein said redistributive pattern has at least one of a vertical orientation, a horizontal orientation and a tilted orientation with respect to said target pattern.

22. The method for designing a reticle for redistributing heat onto a lens of claim 14, wherein said redistributive pattern has a periodic line/space feature with a feature pitch from about 50 nm to about 150 nm.

23. The method for designing a reticle for redistributing heat onto a lens of claim 14, wherein determining if said redistributive pattern along with said target pattern forms said balanced heat load on said lens or not further comprises:
   determining if said redistributive pattern has no substantial aberration response with respect to said lens or not.

24. The method for designing a reticle for redistributing heat onto a lens of claim 23, wherein said redistributive pattern is introduced to render said lens to have said balanced heat load.

25. The method for designing a reticle for redistributing heat onto a lens of claim 14, wherein said redistributive pattern is introduced to maintain an imaging fidelity for said target pattern with respect to said lens.

\* \* \* \* \*